United States Patent
Schauwecker et al.

(10) Patent No.: US 9,715,958 B2
(45) Date of Patent: Jul. 25, 2017

(54) METHOD FOR ENERGIZING A SUPERCONDUCTING MAGNET ARRANGEMENT

(71) Applicant: Bruker BioSpin AG, Faellanden (CH)

(72) Inventors: Robert Schauwecker, Zurich (CH); Patrik Vonlanthen, Schwerzenbach (CH)

(73) Assignee: Bruker Biospin AG, Faellanden (CH)

(*) Notice: Subject to any disclaimer, the term of this patent is extended or adjusted under 35 U.S.C. 154(b) by 336 days.

(21) Appl. No.: 14/799,582

(22) Filed: Jul. 15, 2015

(65) Prior Publication Data
US 2016/0049228 A1 Feb. 18, 2016

(30) Foreign Application Priority Data
Jul. 28, 2014 (DE) .......................... 10 2014 214 796

(51) Int. Cl.
*H01F 1/00* (2006.01)
*H01F 6/00* (2006.01)
(Continued)

(52) U.S. Cl.
CPC ................ *H01F 6/006* (2013.01); *H01F 6/04* (2013.01); *G01R 33/3815* (2013.01); *H01F 6/02* (2013.01)

(58) Field of Classification Search
CPC . H01H 6/00; H01H 6/006; H01H 6/04; F25B 9/00
(Continued)

(56) References Cited

U.S. PATENT DOCUMENTS 3,839,689 A * 10/1974 Biltcliffe ............ G01R 33/3815
174/15.4
3,868,522 A * 2/1975 Bigham ................ H05H 13/00
313/62
(Continued)

FOREIGN PATENT DOCUMENTS

EP 0 730 284 9/1996
JP 58111305 7/1983

OTHER PUBLICATIONS

Naoyuki Amemiya et al., "Magnetic field generated by shielding . . . ", Supercond. Sci. Technol. 21 (2008) 095001 (7pp).
(Continued)

*Primary Examiner* — Shawki S Ismail
*Assistant Examiner* — Lisa Homza
(74) *Attorney, Agent, or Firm* — Paul Vincent

(57) ABSTRACT

A method for charging a magnet arrangement having a superconducting tape conductor with a first transition temperature in a cryostat device. The magnet arrangement is temperature-controlled to a first pre-operating temperature between the first transition temperature and the operating temperature, a first pre-operating current is excited, the magnet arrangement is cooled to operating temperature and a first operating current is excited. The magnet arrangement has a second magnet winding composed of a second superconductor material with a second transition temperature above the operating temperature and at least 15 K below the first transition temperature, wherein a second operating current in the second magnet winding is excited at the latest after cooling of the magnet arrangement to the operating temperature, and with the second operating current the second magnet winding generates a second operating magnetic field in the volume of the first magnet winding.

20 Claims, 11 Drawing Sheets

(51) Int. Cl.
*H01F 6/04* (2006.01)
*G01R 33/3815* (2006.01)
*H01F 6/02* (2006.01)

(58) Field of Classification Search
USPC ............................................ 335/216
See application file for complete search history.

(56) References Cited

U.S. PATENT DOCUMENTS

| | | | | |
|---|---|---|---|---|
| 5,081,436 | A * | 1/1992 | Nishi | H01H 50/021 335/131 |
| 5,361,054 | A * | 11/1994 | Knuttel | G01R 33/3806 324/318 |
| 5,369,387 | A * | 11/1994 | Woods | H01F 6/04 174/17 VA |
| 5,623,240 | A * | 4/1997 | Sakuraba | H01F 6/065 174/15.4 |
| 5,686,877 | A * | 11/1997 | Keller | G01R 33/3815 335/216 |
| 5,735,127 | A * | 4/1998 | Pfotenhauer | F25B 9/14 165/4 |
| 5,757,257 | A * | 5/1998 | Doi | H01L 39/20 324/318 |
| 6,498,552 | B1 * | 12/2002 | Lozano Rico | H01H 50/021 335/124 |
| 6,856,220 | B2 * | 2/2005 | Saruwatari | H01H 50/326 335/17 |
| 6,911,884 | B2 * | 6/2005 | Uotome | H01H 47/06 335/132 |
| 6,914,503 | B2 * | 7/2005 | Saruwatari | H01H 50/08 335/17 |
| 6,924,719 | B2 * | 8/2005 | Saruwatari | H01H 50/08 335/17 |
| 7,157,999 | B2 | 1/2007 | Kasten | |
| 7,400,223 | B2 | 7/2008 | Spreiter | |
| 7,859,371 | B2 * | 12/2010 | Takano | H01H 50/26 335/128 |
| 7,982,566 | B2 | 7/2011 | Kasten | |
| 8,255,022 | B2 * | 8/2012 | Schneider | H01F 6/04 324/318 |
| 8,406,833 | B2 | 3/2013 | Roth | |
| 2006/0066429 | A1 | 3/2006 | Kasten | |
| 2007/0171014 | A1 * | 7/2007 | Iwasa | G01R 33/3802 335/216 |
| 2009/0045895 | A1 * | 2/2009 | Kasten | G01R 33/3815 335/216 |
| 2009/0233797 | A1 * | 9/2009 | Schlenga | H01F 6/06 505/163 |
| 2009/0242785 | A1 * | 10/2009 | Ries | H05H 7/04 250/396 R |
| 2009/0275477 | A1 * | 11/2009 | Roth | H01F 6/04 505/163 |
| 2010/0171495 | A1 * | 7/2010 | Bovier | G01R 33/30 324/309 |
| 2010/0195019 | A1 * | 8/2010 | Shinohara | G02B 6/0016 349/62 |
| 2014/0028316 | A1 * | 1/2014 | Mine | G01R 33/3815 324/318 |
| 2014/0066312 | A1 | 3/2014 | Kasten | |
| 2014/0097920 | A1 * | 4/2014 | Goldie | H01F 6/00 335/216 |
| 2015/0007586 | A1 * | 1/2015 | Kraus | G01R 33/3815 62/51.1 |
| 2015/0015351 | A1 * | 1/2015 | Osumi | H01H 50/06 335/202 |
| 2015/0024941 | A1 * | 1/2015 | Tamura | H01F 6/00 505/211 |
| 2015/0043192 | A1 * | 2/2015 | Tanoue | H01H 9/161 362/23.03 |
| 2015/0114810 | A1 * | 4/2015 | Tanoue | H01H 9/161 200/314 |
| 2015/0234109 | A1 * | 8/2015 | Hirose | G02B 5/0226 362/558 |
| 2016/0069728 | A1 * | 3/2016 | Eshchenko | G01F 23/247 73/295 |

OTHER PUBLICATIONS

Y. Yanagisawa et al., "Effect of current sweep reversal . . . ", Physica C 469 (2009) 1996-1999.
Grigorii P. Mikitik et al., "Theory of the longitudinal . . . ", Physical Review B 67, 104511 (2003).
Ernst Helmut Brandt et al., "Why an ac Magnetic Field Shifts . . . ", Physical Review Letters, vol. 89, No. 2.
Kazuhiro Kajikawa et al., "Reduction of Magnetization . . . ", IEEE Transactions on applied superconductivity, vol. 22, No. 3, Jun. 2012.
Yoshinori Yanagisawa et al., "Effect of YBCO-Coil . . . ", IEEE Transactions on applied superconductivity, vol. 20, No. 3, Jun. 2010.
Y. Yanagisawa et al., "Magnitude of the Screening . . . ", IEEE Transactions on applied superconductivity, vol. 21, No. 3, Jun. 2011.
Min Cheol Ahn "Spatial and Temporal Variations . . . ", IEEE Trans Appl Supercond. Jul. 17, 2009; 19(3):2269-2272.
Yoshinori Yanagisawa et al., "Effect of coil current sweep . . . ", AIP Conference Proceedings 1434, 1373 (2012).
Yoshinori Yanagisawa et al., "Effect of coil current sweep . . . " AIP Conference Proceedings 1434, 1373 (2012).

* cited by examiner

METHOD FOR ENERGIZING A SUPERCONDUCTING MAGNET ARRANGEMENT

This application claims Paris convention priority from DE 10 2014 214 796.4 filed Jul. 28, 2014 the entire disclosure of which is hereby incorporated by reference.

BACKGROUND OF THE INVENTION

The invention relates to a method for energizing a superconducting magnet arrangement which is disposed in a cryostat device for cooling to a cryogenic operating temperature and which has a first magnet winding comprising a tape conductor with a first superconductor material and a first transition temperature above the operating temperature, the method comprising the following steps:
(a) temperature-controlling of the magnet arrangement to a first pre-operating temperature between the first transition temperature and the operating temperature,
(b) excitation of a first pre-operating current after the first pre-operating temperature is reached at least in a part of the first magnet winding,
(c) cooling the magnet arrangement to the operating temperature,
(b) excitation of a first operating current at least in a part of the first magnet winding at the latest after the operating temperature is reached, wherein the first magnet winding with the first operating current generates a first operating magnetic field in the volume of the first magnet winding.

Such a method is known from the publication by Y. Yanagisawa et al., "Effect of coil current sweep cycle and temperature change cycle on the screening current-induced magnetic field for YBCO-coated conductor coils", AIP Conference Proceedings 1434, 1373 (2012) (=Reference [9]).

Many magnetic resonance methods require static magnetic fields which are as homogeneous as possible, for example in order to achieve a high spectral resolution in the case of a spectroscopic method or in order to achieve sharp imaging which is as free of distortion as possible in the case of an imaging method. Superconducting magnet arrangements are usually employed for field generation.

After charging of such a superconducting magnet arrangement with tape conductors, in particular high-temperature superconductors (=HTS), partially persistent screening currents can flow in the tape which reduce the field strength of the magnet arrangement, or lead to field inhomogeneities and field instability. This is described in detail for example in reference [1].

Different methods and arrangements for cancellation of screening currents on the charged magnet are known. These are based on the following ideas: Running through field cycles, high-frequency field excitations, optimization of the coil design (design relating to coil shape, conductor geometry, current-carrying capacity of the superconductor).

There is also the idea of not eliminating the screening currents, but taking the effects thereof into consideration in the design of the magnet arrangement and providing corresponding possibilities for field correction (for example shim coils).

The prior art documents cited in the list of references given at the end of the description disclose the following aspects which are fundamental as the starting point for the present invention:
[1] magnet arrangement with tape-like HTS windings, e.g. for high-field NMR (nuclear resonance) applications. After charging of HTS tape conductors partially persistent screening currents flow which reduce the field strength of the magnet arrangement or lead to field inhomogeneity and field instability.
[2] magnet arrangement with HTS and LTS (=low-temperature superconductor) windings, for example for high-field NMR applications. Due to overcurrent cycles in the HTS part, the field drift is minimized after the final current is reached.
[3] "longitudinal vortex shaking" by a high-frequency magnetic field in an HTS magnet winding. The high-frequency field is perpendicular to the static field of the HTS magnet winding and parallel to the tape direction.
[4] "transverse vortex shaking" by a high-frequency magnetic field in an HTS magnet winding. The high-frequency field is perpendicular to the static field of the HTS magnet winding and transverse with respect to the tape direction.
[5] "vortex shaking" by a high-frequency magnetic field in an HTS magnet winding. Arrangements of copper coils for generation of the high-frequency field are shown.
[6] Multifilament HTS tape conductors reduce the undesirable field contributions of the screening currents. Overcurrent cycles for stabilization of the field drift and reduction of the field inhomogeneity due to screening currents. Calculation of the screening current intensities as a function of the form factor of the HTS winding.
[7] Calculation of the screening current intensities in an HTS winding as a function of the coil shape, conductor width and the critical current of the superconductor. The optimum is a narrow conductor, small coil diameter, and substantial operating current in relation to the critical current.
[8] Measurement of the effect of screening currents in an arrangement of a plurality of coaxial HTS pancake coils at a temperature of 77 K in the self-field and/or in a background field. Verification of a simulation method for the design of field homogenization coils (shims) for compensation for the field inhomogeneity due to the screening currents in the HTS winding in particular in a magnet arrangement with HTS and LTS windings for high-field NMR applications.
[9] Reduction of the screening currents by field and temperature cycles. The effect of the temperature cycles on the screening currents in an HTS winding (YBCO) is studied experimentally in the range from 77 to 82 K and proposed for cryocooler-cooled magnet arrangements (see for instance page 1379: "This kind of coil temperature cycle is available for cryocooler cooled YBCO magnets.").

This prior art according to reference [9]—already cited above—is the closest to the intellectual starting point of the present invention:
After charging of a magnet arrangement, the temperature is temporarily increased, so that the screening currents are eliminated to some extent. This condition is then "frozen" at the operating temperature with further cooling.

However, until now this method has only been known for pure HTS magnet arrangements. If a part of the magnet arrangement comprises a low-temperature superconductor, this method could not be used hitherto because with it the charged magnet would be heated above the transition temperature of the low-temperature superconductor, which would inevitably result in "quenching" of the system, that is to say a breakdown of the superconducting currents in the magnet arrangement.

The object of the present invention is to provide a method of the type defined in the introduction, in which upon charging of superconducting magnet arrangements with combined magnet windings made of superconducting materials having significantly different transition temperatures, in particular in the case of systems with low-temperature superconductors (LTS) and high-temperature superconductors (HTS), elimination or prevention of screening currents by temperature-controlling of the magnet arrangement as well as subsequent freezing of the condition with reduced screening currents is achieved upon cooling to the operating temperature, without eliminating currents in the magnet windings having the material with a lower transition temperature (in particular LTS material).

SUMMARY OF THE INVENTION

This object is achieved in a surprisingly simple way and also with readily available technical means by a modification of a method having the features referred to in the introduction, which is characterized in that the magnet arrangement comprises a second magnet winding composed of a second superconductor material with a second transition temperature above the operating temperature and at least 15 K below the first transition temperature, and that the charging method comprises excitation of a second operating current at least in a part of the second magnet winding at the latest after cooling of the magnet arrangement to the operating temperature, wherein with the second operating current the second magnet winding generates a second operating magnetic field in the volume of the first magnet winding.

Screening currents in the tape-like superconductor and the undesirable effects thereof on the strength, homogeneity and stability of the magnetic field are already prevented during cooling and charging of the magnet arrangement, so that subsequent measures for reduction or stabilization of the screening currents can be omitted at least to some extent. As a result the expenditure on both the apparatus and the method is reduced, and technical risks (for example: quenching of the magnet arrangement) are avoided. Moreover an efficient suppression of screening currents proves better and more effective by prevention from the outset than by suppression in retrospect. The most efficient suppression of screening currents may be expected from a combination of the method according to the invention with known methods for subsequent suppression of screening currents. Methods for preventing screening currents already at the time of cooling and charging of a magnet arrangement were known in the past only for pure HTS magnet arrangements. Now owing to the method according to the invention for example they can also be applied to magnet arrangements with windings consisting of high-temperature and low-temperature superconductors (HTS+LTS), which are important in particular for high-field NMR applications.

An especially preferred class of embodiments of the method according to the invention is one in which the magnet arrangement is temperature-controlled to at least a further pre-operating temperature between the first transition temperature and the operating temperature and then a further pre-operating current is excited at least in a part of the first magnet winding. These embodiments of the method take account of the fact that the superconducting current-carrying capacity of the tape conductor in the first magnet winding increases as the temperature decreases. For example in the case of a further pre-operating temperature a higher pre-operating current can be excited than in the case of a higher first pre-operating temperature, so that screening currents in the tape conductor can be suppressed even better.

Advantageous modifications of these embodiments are characterized in that the sequence of pre-operating temperatures and/or pre-operating current excitation stages is refined in such a way that a continuous temperature-controlling and cooling procedure of the magnet arrangement to the operating temperature and/or a continuous sequence of pre-operating current excitation stages in the first magnet winding are achieved. In this way the pre-operating currents are for example already excited during the cooling operation of the magnet arrangement without the cooling operation having to be stopped at specific discrete pre-operating temperatures.

Particularly preferred variants of this class of embodiments are characterized in that the temperature-controlling of the superconducting magnet arrangement to a first or a further pre-operating temperature takes place by filling of a container of the cryostat arrangement with liquid nitrogen or by the operation of a cryocooler. Magnet arrangements which are cooled by a liquid gas bath are typically precooled by liquid nitrogen, the boiling temperature of which is below the transition temperature of certain high-temperature superconductors. Thus at this temperature a pre-operating current can already be excited. In the case of cooling by a cryocooler the method according to the invention is particularly advantageous, because the temperature of the magnet arrangement can be adjusted by control of the cryocooler output, which simplifies the targeted temperature-controlling to a pre-operating temperature.

Particularly preferred variants of this class of embodiments are characterized in that temperature-controlling of the superconducting magnet arrangement to the operating temperature takes place by filling of a container of the cryostat arrangement with liquid helium or by the operation of a cryocooler. Because the cooling procedure of a magnet arrangement cooled by a liquid gas bath by introduction of liquid helium into a container of the cryostat arrangement can take several hours, during this phase pre-operating currents can be excited in the first magnet coil as soon as the temperature of the magnet arrangement has fallen below the first transition temperature. In the case of cooling by a cryocooler the method according to the invention is particularly advantageous, because the temperature of the magnet arrangement can be adjusted by control of the cryocooler output, which simplifies the targeted temperature-controlling to a pre-operating temperature.

In further advantageous embodiments of the method according to the invention a first and/or a further excited pre-operating current in the first magnet winding at a first and/or a further pre-operating temperature amounts to at least 50%, preferably at least 70%, in particular at least 90% of the superconducting current-carrying capacity at least in a part of the first magnet winding at this temperature and in the self-field of the first magnet winding. When the superconducting current-carrying capacity in the first magnet winding is largely exhausted by the excited pre-operating current, only minimal screening currents can flow.

For example, a pre-operating temperature may be selected so that the superconducting current-carrying capacity at least in a part of the first magnet winding is only slightly (in particular a few percent to several tens of percent) above the first operating current, so that the entire first operating current can be excited as pre-operating current without build-up of significant screening currents due to a large current-carrying capacity reserve in the first magnet winding. In this selection of a pre-operating temperature it should be taken into account that the superconducting current-carrying capacity in the relevant part of the first magnet winding is dependent not only upon the temperature but also upon the magnetic field which is generated by the first magnet winding with the pre-operating current in the volume of the magnet winding.

Embodiments of the method according to the invention are also advantageous in which a first and/or a further excited pre-operating current and the first operating current form a chronologically monotonically increasing sequence of current intensities in the first magnet winding. Thus for example during the cooling procedure of the magnet arrangement the current excitation curve in the first magnet winding can follow, at a small distance, the monotonically increasing curve of the superconducting current-carrying capacity of the first magnet winding as the temperature decreases, until the first operating current is achieved. Thus screening currents due to a large current-carrying capacity reserve in the first magnet winding are continuously suppressed.

In a further preferred variant of the method a first and at least one further pre-operating temperature and the operating temperature form a chronologically monotonically decreasing sequence of temperatures. Thus for example the cooling procedure of the magnet arrangement to the operating temperature can be used for temperature-controlling to the pre-operating temperature(s).

Variants of the method are also preferred in which a first and/or at least one further excited pre-operating current and the first operating current form a chronological sequence of current intensities in the first magnet winding, the values of which decrease towards the end of the sequence, so that in particular the first operating current is smaller than a first excited pre-operating current and/or smaller than at least one further excited pre-operating current. When the current in the first magnet winding decreases to the first operating current, the magnetic field generated by the first magnet winding with its current in the volume of said winding is reduced. Thus for example it is possible to compensate for a field contribution generated by the second magnet winding after excitation of the second operating current in the volume of the first magnet winding.

Embodiments of the method according to the invention are also especially preferred in which the magnet arrangement is operated after charging in a steady state with constant operating temperature and with constant first and second operating current, in particular as a part of an arrangement for magnetic resonance processes. Such magnet arrangements are cooled and charged only a few times during their life cycle, so that a charging process for preventing permanently flowing screening currents over a particularly long period of time is worthwhile.

Moreover, such magnet arrangements are frequently used for applications which are particularly demanding with regard to field homogeneity and field stability in a working volume.

A method according to the invention as described above falls within the scope of the present invention, characterized in that the superconducting magnet arrangement is configured in such a way that the first operating magnetic field at least at one location within the first magnet winding has a component perpendicular to the tape plane which is at least twice as strong as the component perpendicular to the tape plane of the second operating magnetic field at this location. Screening currents are generated in particular by the magnetic field component perpendicular to the tape plane. For example the self-field of a solenoid-like first magnet winding consisting of a high-temperature superconductor tape has a field component perpendicular to the tape plane on the two coil edges. Such coils can be operated within a second magnet winding composed of low-temperature superconductors disposed coaxially around said coils. If the second magnet winding is designed to be substantially longer than the first one in the direction of the common axis, its contribution to the perpendicular field component in the volume of the first magnet winding remains insignificant. The charging method according to the invention is particularly advantageous for such a magnet arrangement, because after running through the sequence of temperature-controlling and pre-operating current excitation stages in the first magnet winding no significant new screening currents can be built up due to the excitation of the second operating current in the second magnet winding. Furthermore, magnet arrangements of this type have the advantage that the wound amount of high-temperature superconductor tape can be minimized, which reduces the production costs.

A method according to the invention is also preferred in which the superconducting magnet arrangement is configured in such a way that the second operating magnetic field at least at one location within the first magnet winding has a component perpendicular to the tape plane which is at least 5% of the field strength of the second operating magnetic field at this location, wherein the method of charging the magnet arrangement is characterized in that the first magnet winding at this location, after the temperature-controlling to a first or a further pre-operating temperature and the excitation of a first or further pre-operating current, generates a magnetic field of which the component perpendicular to the tape plane corresponds to the sum of the component perpendicular to the tape plane of the first operating magnetic field and at least half of the component perpendicular to the tape plane of the second operating magnetic field at this location. If because of boundary conditions for the design of the magnet arrangement (for example space restrictions) it is not possible to prevent the second magnet winding in operation from generating a significant field component perpendicular to the tape plane in the volume of the first magnet winding, then by this embodiment of the method according to the invention screening currents in the tape conductor due to the excitation of the second operating current in the second magnet winding are avoided because the additional field component perpendicular to the tape plane of the second magnet winding is compensated by a reduction of the field component perpendicular to the tape plane of the first magnet winding.

An especially preferred class of embodiments of the method according to the invention is characterized in that the first magnet winding is wound at least partially with HTS material and the second magnet winding is wound at least partially with LTS material. Of these two classes of superconductor, conductors with a sufficient length and quality are available for use in magnets. Magnet arrangements with high-temperature superconductors can generate stronger magnetic fields than pure low-temperature superconductor magnets. A magnet arrangement with a low-temperature superconductor winding and a high-temperature insert coil likewise generates stronger fields than a pure low-temperature superconductor magnet, but is more cost-effective than a pure high-temperature superconductor magnet. Because high-temperature superconductors can be provided in the form of tape conductors, a method for preventing screening currents in such magnet arrangements is particularly advantageous. Such methods are particularly effective when they comprise temperature-controlling of the at least partially current-carrying magnet arrangement significantly above the operating temperature. Owing to the method according to the invention the temperature-controlling range for mixed high-/low-temperature superconductor magnet arrangements is not limited by the transition temperature of the low-temperature superconductor, which is a precondition for effective elimination of screening currents in the high-temperature superconductor by temperature-controlling of the magnet arrangement.

Advantageous modifications of these embodiments are characterized in that the first magnet winding comprises a tape conductor with a HTS in the form of a thin layer, in particular of the type ReBCO (Re="rare earth", for example yttrium), and the second magnet winding comprises NbTi and/or $Nb_3Sn$. These classes of superconductors are fully developed for use in magnets and are available in sufficient lengths. The conductor geometry of ReBCO tapes favors screening currents, and for this reason a charging method for prevention thereof in magnet arrangements with these conductors is particularly advantageous.

Modifications are also preferred in which the first magnet winding comprises a plurality of coaxially stacked pancake coils or a solenoid coil. These are the two most common forms of magnet windings of tape conductors. Both generate in the volume of the winding, towards the two coil ends, a magnetic field having a significant component perpendicular to the tape plane which favors the formation of screening currents. Therefore a method for preventing screening currents in such magnet arrangements is particularly advantageous.

In alternative or supplementary modifications the first and second magnet windings have a total of at least three current connections, of which at least a first one only contacts the first magnet winding and at least one other only contacts the second magnet winding and at least one further one only contacts the first magnet winding or the first and second magnet windings together. The excitation of different currents in the first and second magnet winding during the application of the method according to the invention requires that these have separate current connections. Because power supply lines to a superconducting magnet arrangement provide an undesirable heat input, the number of supply lines should be minimized. For two superconducting magnet windings with different currents at least one supply line per winding and one common return line are required.

Finally, particularly preferred modifications are characterized in that the first and second magnet windings form a series connection, so that in particular the first and the second operating current are equally strong. In such a magnet arrangement the first and second magnet windings can be bridged with a common superconducting switch and can be operated persistently after the charging. When the magnet arrangement in the operational state remains connected to a current source, only two supply lines are still current-carrying. Thus in both cases the heat input through the supply lines into the cryostat arrangement can be minimized.

In practice the method according to the invention will have applications in apparatus in which the superconducting magnet arrangement is part of a magnetic resonance device, in particular an NMR spectrometer, an MRI scanner, an EPR device or an ion cyclotron resonance device. These devices are all used in a manner in which a spatially very homogeneous and temporally very stable magnetic field in a working volume is a prerequisite for an optimal measurement result. Furthermore in these devices the adjustment possibilities of the magnetic field homogeneity by means of shims and the possibilities for compensating for field drift are limited by the available hardware. In operation of these devices particular advantage is taken of the method according to the invention, which achieves the best possible homogeneity and stability of the magnetic field taking these hardware limits into account.

Advantageous embodiments and advantages of the invention are apparent from the description and the drawings. Likewise the features referred to above and the further features set out here can each be used according to the invention alone or several can be used in any combinations. The embodiments shown and described should not be understood as a definitive listing, but rather as examples for explanation of the invention.

Embodiments of the invention are illustrated in the drawings:

DESCRIPTION OF THE PREFERRED EMBODIMENT

Figure 1A:
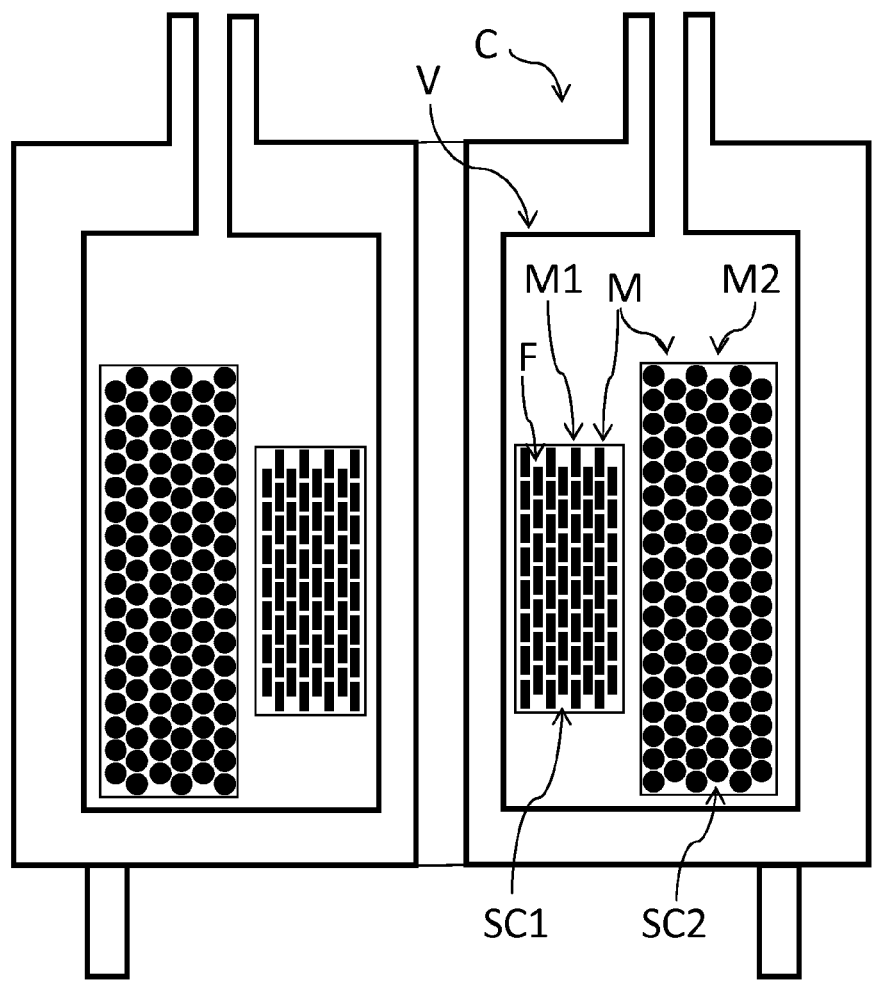
FIG. 1a shows a schematic sectional representation of a magnet arrangement for carrying out the method according to the invention which is disposed in a cryostat device for cooling to a cryogenic operating temperature by means of filling of a container with a cryogenic liquid.

FIG. 1a shows a schematic sectional representation of a superconducting magnet arrangement M for carrying out the method according to the invention. It comprises a first magnet winding M1 with a tape conductor F composed of a first superconductor material SC1 and a first transition temperature Tc1 and a second magnet winding M2 composed of a second superconductor material SC2 with a second transition temperature Tc2 at least 15 K below the first transition temperature Tc1.

The magnet arrangement M is disposed in a cryostat device C for cooling to a cryogenic operating temperature T0. The cooling of the magnet arrangement M to the operating temperature T0 or the temperature-controlling of the magnet arrangement M to a pre-operating temperature T1, T2 may take place by filling of a container V with a cryogenic liquid, for example liquid nitrogen or liquid helium.

Figure 6:
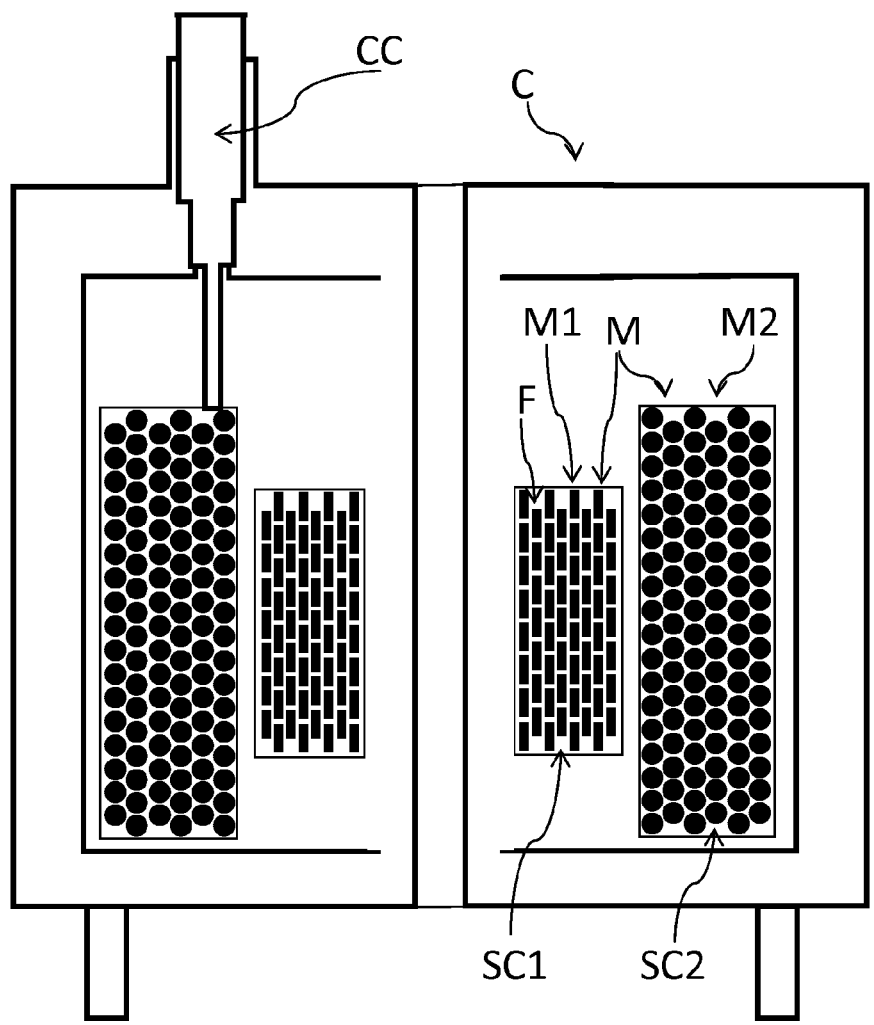
FIG. 6 shows a schematic sectional representation of a magnet arrangement for carrying out the method according to the invention which is disposed in a cryostat device for cooling to a cryogenic operating temperature by means of a cryocooler.

As an alternative to this, FIG. 6 shows a cryostat device C with a cryocooler CC for cooling the magnet arrangement M.

Figure 1B:
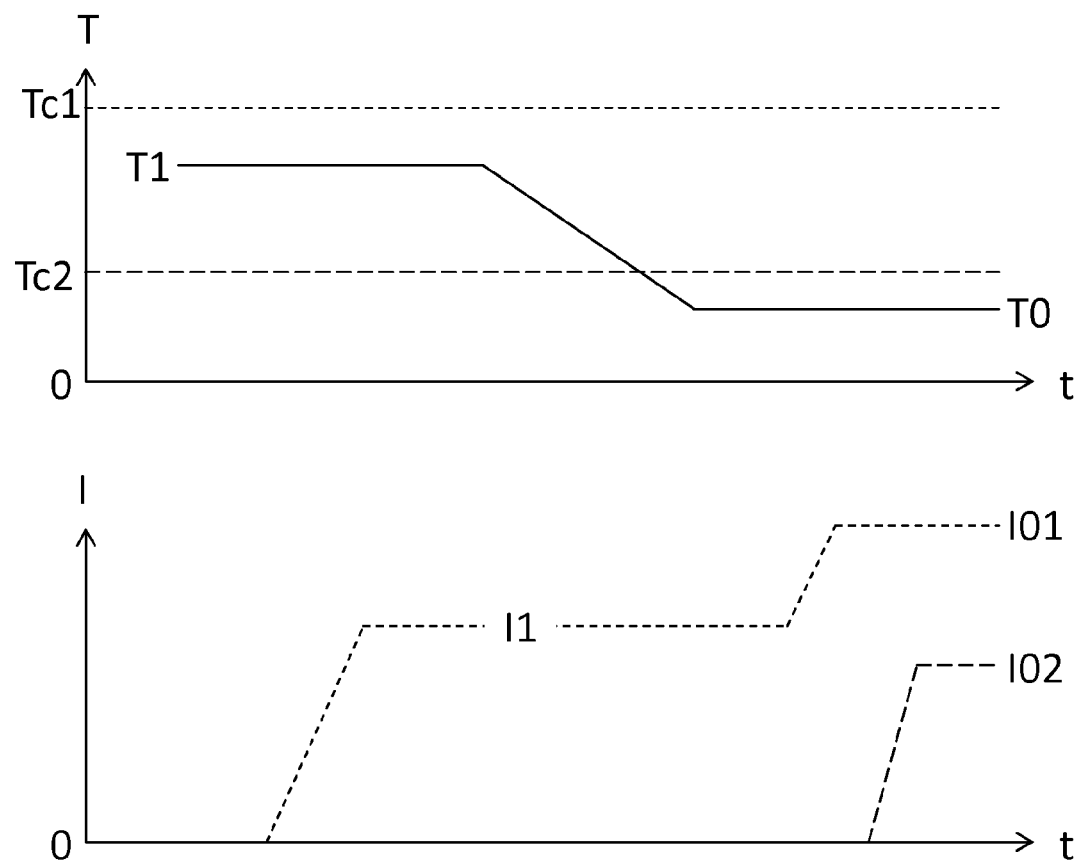
FIG. 1b shows the progression over time of the temperature of the magnet arrangement according to the invention and of the currents flowing in the magnet windings thereof when the charging method according to the invention is used.

FIG. 1b shows the progression over time of the temperature T of the magnet arrangement M and the currents I excited in its first and second magnet windings M1 and M2 when the charging method according to the invention is used. The progression of the temperature over time and the current progression are shown synchronized by means of a common time axis t. The progression of the current over time in the first magnet winding M1 follows the fine broken line in the l(t) diagram, and the current in the second magnet winding M2 follows the coarse broken line. The method comprises temperature-controlling the magnet arrangement M to a first pre-operating temperature T1 between the first transition temperature Tc1 and the operating temperature T0, the excitation of a first pre-operating current I1 after reaching the first pre-operating temperature T1 at least in a part of the first magnet winding M1, the cooling of the magnet arrangement M to the operating temperature T0 and the excitation of a first and second operating current I01 and I02 at least in each case in a part of the first and second magnet windings M1 and M2.

Figure 2:
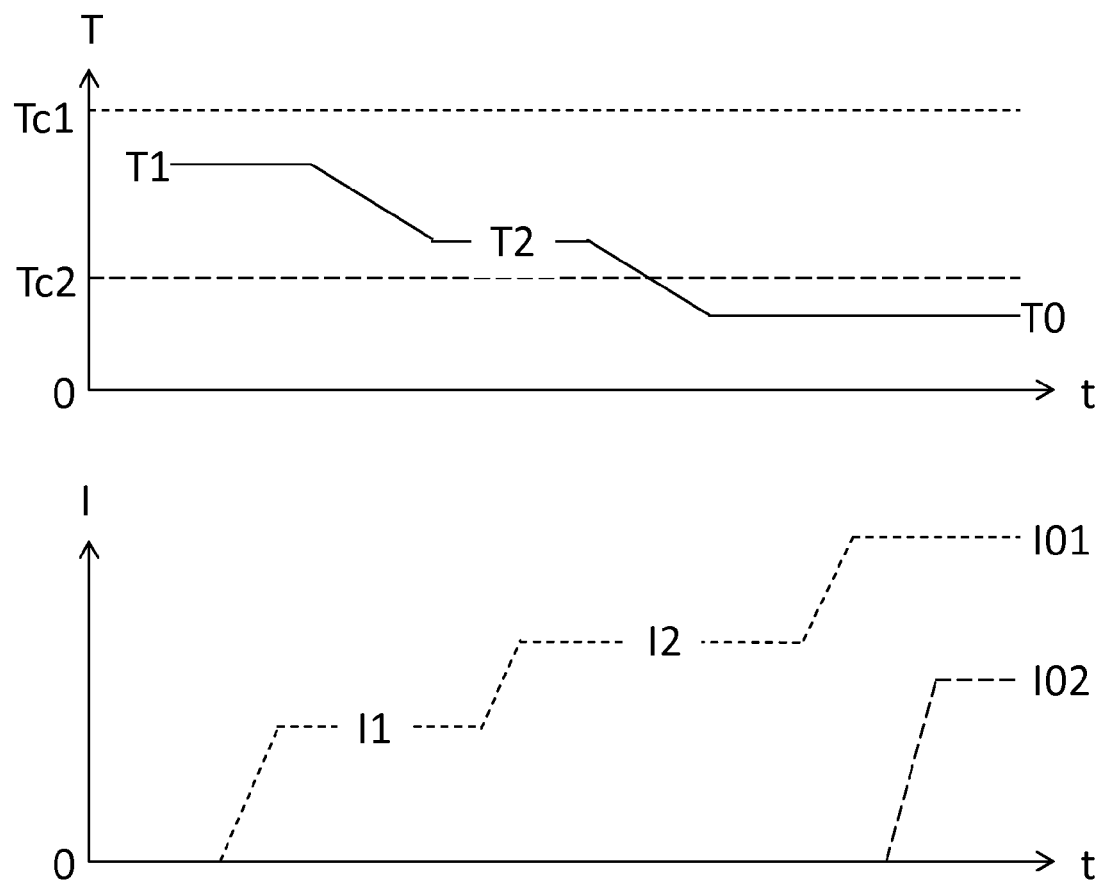
FIG. 2 shows the progression over time of the temperature of the magnet arrangement according to the invention and the currents flowing in the magnet windings thereof when the charging method according to the invention is used with a plurality of temperature-controlling and current excitation stages.

FIG. 2 shows an embodiment of the method according to the invention in which the magnet arrangement M is additionally temperature-controlled to a further pre-operating temperature T2 between the first transition temperature Tc1 and the operating temperature T0, after which a further pre-operating current I2 is excited at least in a part of the first magnet winding M1.

Figure 3:
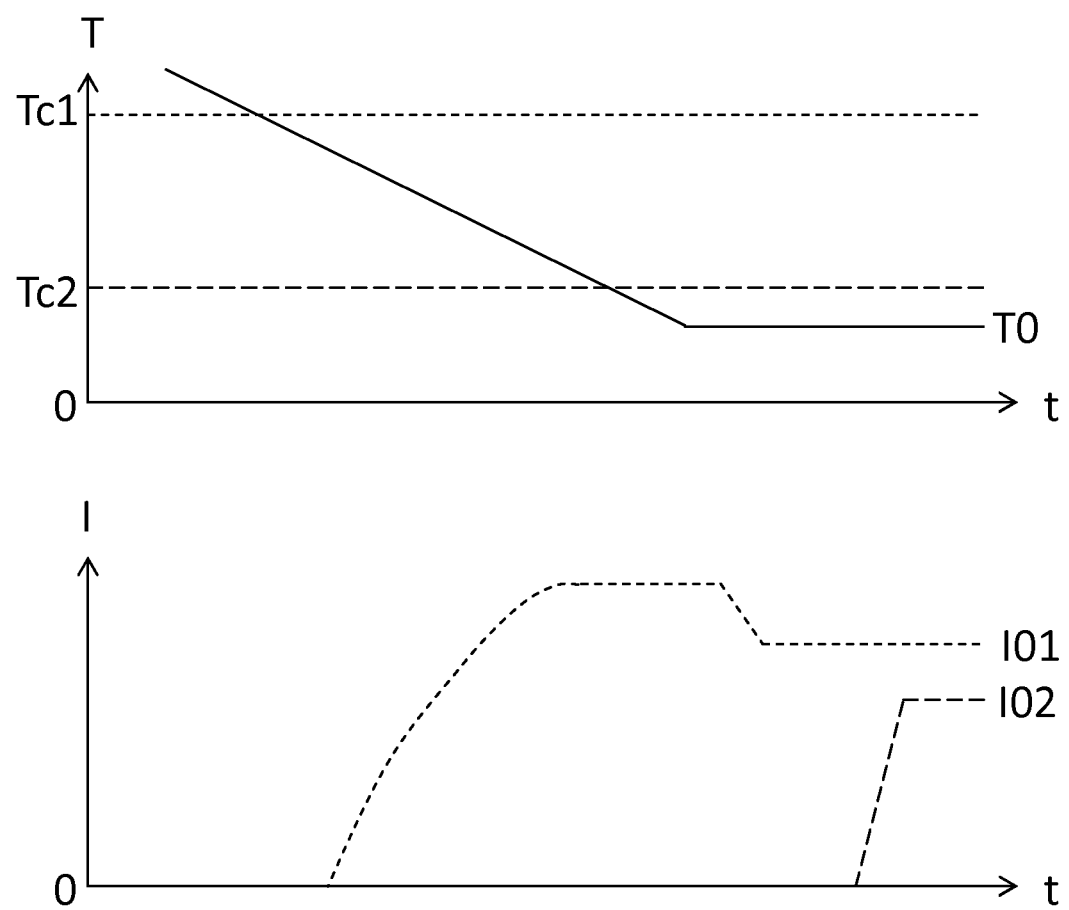
FIG. 3 shows the progression over time of the temperature of the magnet arrangement according to the invention and of the currents flowing in the magnet windings thereof when the charging method according to the invention is used with a continuous temperature-controlling and current progression.

FIG. 3 shows an embodiment of the method according to the invention with a refinement of the intervals between the pre-operating temperatures and pre-operating current excitation stages up to the limit of a continuous cooling procedure of the magnet arrangement M to the operating temperature T0 and a simultaneous continuous sequence of pre-operating current excitation stages in the first magnet winding M1. The cooling of the magnet arrangement M to the operating temperature T0 typically lasts for several hours both in the case of introduction of a cryogenic liquid into a container V of the cryostat device C and also with the operation of a cryocooler CC. On the other hand the excitation of pre-operating currents in the first magnet winding M1 can take place substantially more quickly, so that a sequence or continuous succession of pre-operating currents can be run through during the cooling procedure without this cooling procedure having to be stopped at times.

Figure 4:
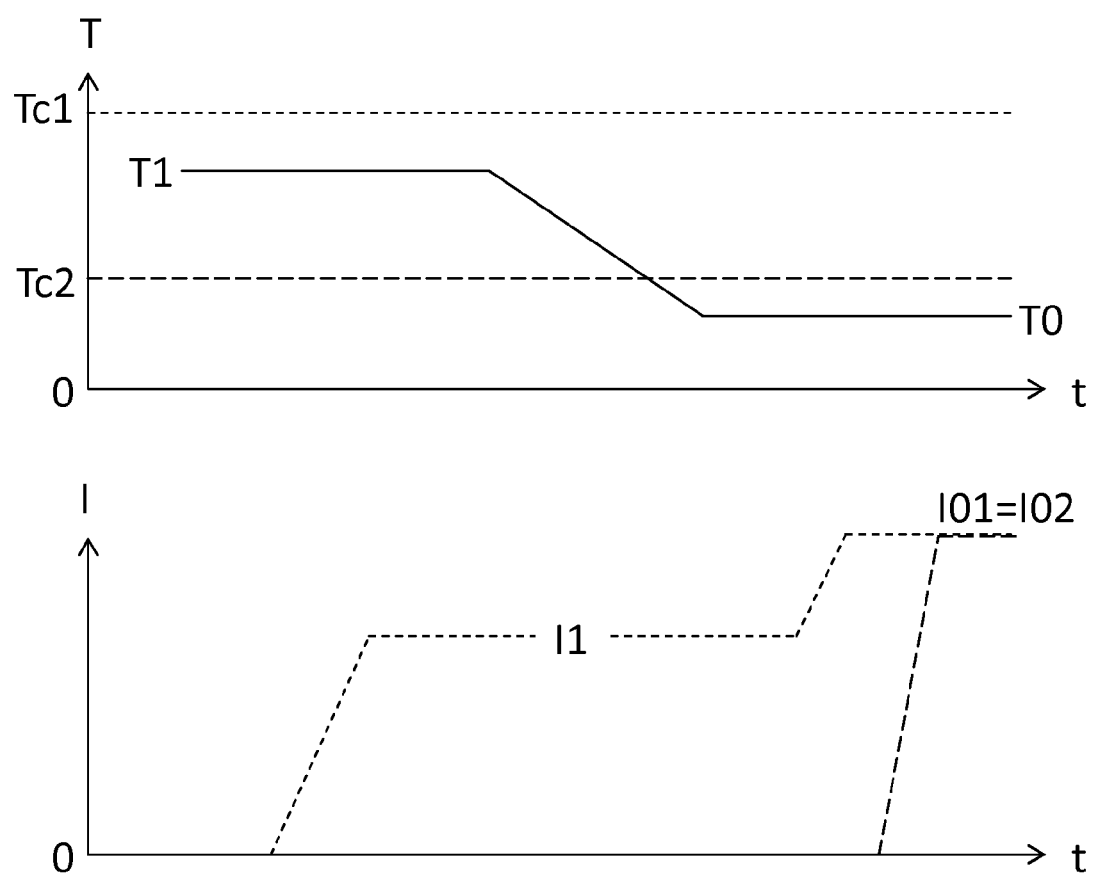
FIG. 4 shows the progression over time of the temperature of the magnet arrangement according to the invention and of the currents flowing in the magnet windings thereof when the charging method according to the invention is used with the same operating currents in the first and second winding.

FIG. 4 shows an embodiment of the method according to the invention, wherein the operating currents I01 and I02 in the first and second magnet windings M1 and M2 are the same.

Figure 8:
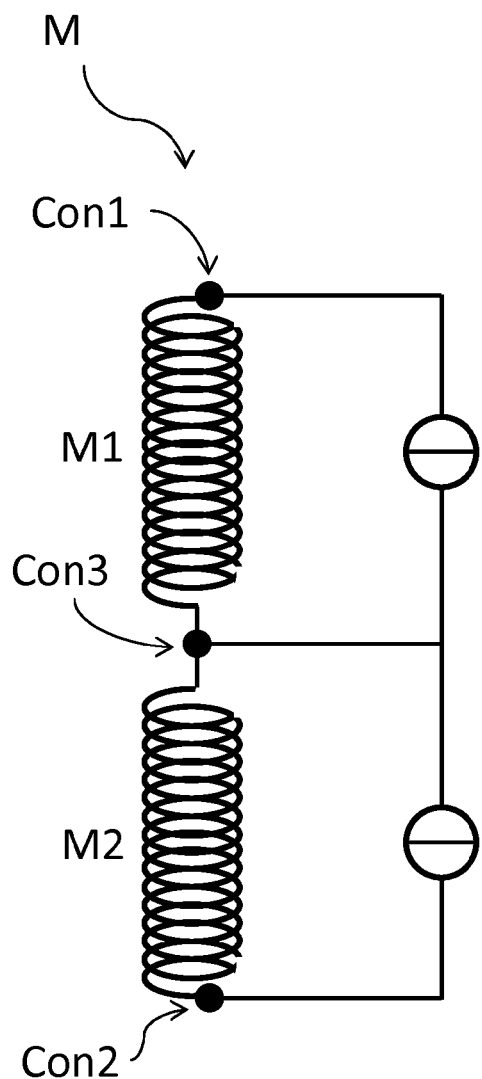
FIG. 8 shows the electrical circuit diagram of a magnet arrangement for carrying out the method according to the invention comprising the minimum necessary number of three current connections for excitation of different currents in the first and second magnet windings and with two current sources.

Furthermore if the first and second magnet windings M1 and M2 form a series connection, as shown in FIG. 8, they can be bridged by a common superconducting switch after excitation of the operating current I01=I02, so that the power supply lines can be switched off or even removed. On the other hand if the operating current flows permanently over the power supply, under the condition that the operating currents are the same I01=I02, one of the two power supplies required for the charging process can be omitted, and one of the three power supply lines required for the charging process is de-energized.

All these embodiments reduce the heat input into the cryostat device C. This is especially advantageous for magnet arrangements M which after the cooling and charging procedure are operated in a steady state with constant operating temperature T0 and constant first and second operating currents I01 and I02, that is to say for example for magnet arrangements M which are used in magnetic resonance applications.

Figure 5:
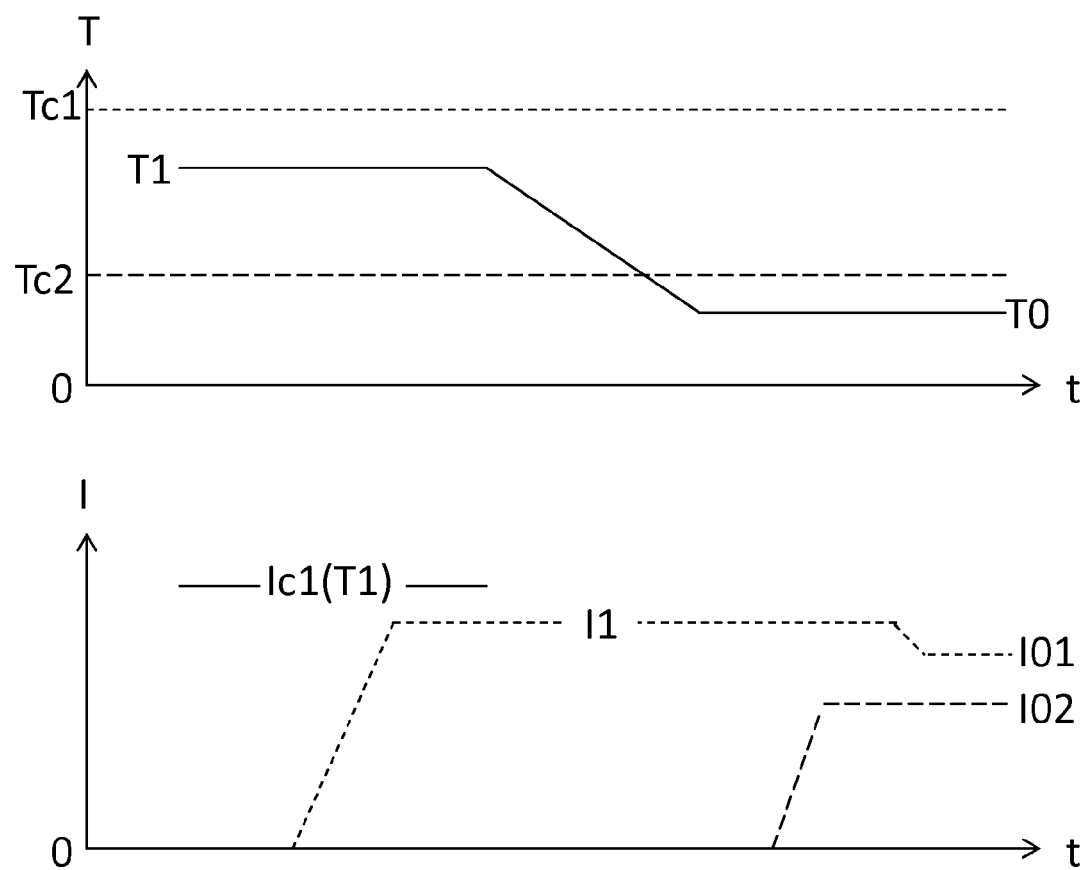
FIG. 5 shows the progression over time of the temperature of the magnet arrangement according to the invention and of the currents flowing in the magnet windings thereof when the charging method according to the invention is used with a first pre-operating current of approximately 90% of the superconducting current-carrying capacity in a part-volume of the first magnet winding at this temperature and in the self-field of the first magnet winding at this current.

FIG. 5 shows an embodiment of the method according to the invention in which a first pre-operating temperature T1 is determined according to a criterion which is explained below. In the first magnet winding M1 the first operating current I01 in the entire winding is necessarily below the superconducting current-carrying capacity Ic1 of the tape conductor F at the operating temperature T0. Because the superconducting current-carrying capacity of the tape conductor F is dependent not only upon the temperature but also the magnetic field at the location of the conductor, the ratio of operating current I01 to the superconducting current-carrying capacity Ic1 in the volume of the first magnet winding M1 assumes different values less than one. Undesirably strong screening currents flow in the tape conductor F in particular where this ratio is very much less than one (for example<0.5) and the magnetic field has a significant component perpendicular to the tape plane.

If in the first magnet winding M1 in the operational state these conditions are met at least at one location, then a first pre-operating temperature T1 is selected such that the first pre-operating current I1 exhausts the superconducting current-carrying capacity Ic1 of the tape conductor F at this critical location to a maximum (to at least 50%, advantageously up to at least 90%), taking into account the dependence of the superconducting current-carrying capacity Ic1 upon the pre-operating temperature T1 and upon the self-field of the first magnet winding M1 with the pre-operating current I1 at the critical location. In addition the pre-operating temperature T1 must be chosen low enough for the pre-operating current I1 to be below the superconducting current-carrying capacity Ic1 of the tape conductor F in the complete volume of the magnet winding M1.

It is advantageous at least to excite the strength of the first operating current IO1 as pre-operating current I1. In fact if, after the cooling of the magnet arrangement M to the operating temperature T0, the current in the first magnet winding M1, and thus also the field contribution thereof at the critical location, were increased again, then because of the higher superconducting current-carrying capacity Ic1 of the tape conductor F at the operating temperature T0 at the critical location much stronger screening currents would flow than if the entire first operating current I01 were already excited at the highest possible pre-operating temperature T1.

If in the operational state the second magnet winding M2 at the critical location makes a field contribution with a significant component perpendicular to the tape plane of the conductor and thus generates screening currents at the critical location, then a lower first pre-operating temperature T1 and a higher first pre-operating current I1 than in the previous example are selected. Then after excitation of the second operating current I02 in the second magnet winding M2 the current in the first magnet winding M1 is lowered from the strength I1 to the operating value I01, and thus the field contribution of the first magnet winding M1 at the critical location is also reduced, so that at best the field contribution of the second magnet winding M2 at this location is compensated (in particular the field component perpendicular to the tape plane), and the screening currents due to the excitation of the second operating current I02 in the second magnet winding M2 are reduced again. The embodiment is shown in FIG. 5.

The embodiments of the method according to the invention shown in FIGS. 1a to 5 show pre-operating temperatures T1, T2 between the first and second transition temperature Tc1, Tc2. However, pre-operating temperatures below Tc2 are also possible.

The embodiments of the method according to the invention shown in FIGS. 1a to 5 show in particular:
 a chronologically monotonically increasing sequence of current intensities consisting of a first and at least one further pre-operating current I1, I2 and the first operating current I01,
 a chronological sequence of current intensities consisting of a first and at least one further pre-operating current I1, I2 and the first operating current I01, the values of which decrease towards the end of the sequence, so that in particular the first operating current I01 is smaller than a first excited pre-operating current I1 and/or smaller than at least one further excited pre-operating current I2.
 a chronologically monotonically decreasing sequence of temperatures of a first and at least one further pre-operating temperature T1, T2 and the operating temperature T0.

These embodiments of sequences of current excitations in the first magnet winding M1 and temperatures of the magnet arrangement M are exemplary and should not be understood as a definitive listing of embodiments. For example sequences with increasing pre-operating temperatures T1, T2 are also possible.

FIG. 6 shows a schematic sectional representation of a superconducting magnet arrangement M for carrying out the method according to the invention. It comprises a first magnet winding M1 with a tape conductor F composed of a first superconductor material SC1 and a first transition temperature Tc1 and a second magnet winding M2 composed of a second superconductor material SC2 with a second transition temperature Tc2 at least 15 K below the first transition temperature Tc1.

The magnet arrangement M is disposed in a cryostat device C for cooling to a cryogenic operating temperature T0. The cooling of the magnet arrangement M to the operating temperature T0 or the temperature-controlling of the magnet arrangement M to a pre-operating temperature T1, T2 takes place by the operation of a cryocooler.

Figure 7A:
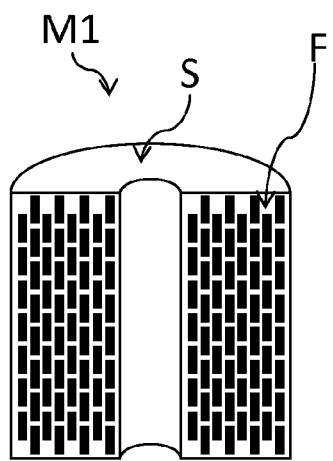
FIG. 7a shows a schematic sectional representation of a first magnet winding of a magnet arrangement for carrying out the method according to the invention in the form of a solenoid coil.
Figure 7B:
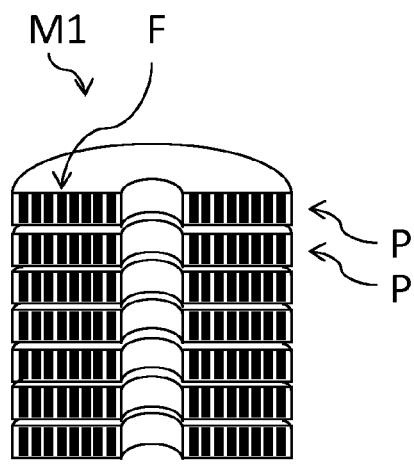
FIG. 7b shows a schematic sectional representation of a first magnet winding of a magnet arrangement for carrying out the method according to the invention in the form of a plurality of coaxially stacked pancake coils.

FIG. 7a shows a schematic sectional representation of a first magnet winding M1 in which the tape conductor F is wound in the form of a solenoid coil. As an alternative to this, with the tape conductor F a plurality of pancake coils P are wound and coaxially stacked, as shown in FIG. 7b.

FIG. 8 shows an electrical circuit diagram of a magnet arrangement M comprising a first and second magnet winding M1 and M2 and at least three current connections Con1, Con2 and Con1, on which the supply lines from the current sources to the magnet windings M1, M2 are contacted for excitation of the pre-operating and operating currents. In such a magnet arrangement M the currents which differ at least intermittently in the first and second magnet windings M1 and M2 can be excited independently of one another.

When the first and second operating currents I01 and I02 have the same strength, the power supply line at the connection point Con3 is de-energized in the operational state of the magnet arrangement M.

If the first and second magnet windings M1 and M2 in the operational state after excitation of the operating currents I01 and I02 are bridged together or individually by superconducting switches, all power supply lines can be switched off as the current sources are reduced to zero. Both supply lines and current sources can then be removed. This so-called "persistent mode" is advantageous especially when the magnet arrangement M remains permanently in operation. Thus the heat input into the cryostat device C can be minimized. Furthermore this operational state with particularly low susceptibility to disturbance is particularly advantageous for sensitive applications of the magnet arrangement M for example for magnetic resonance processes.

Figure 9A:
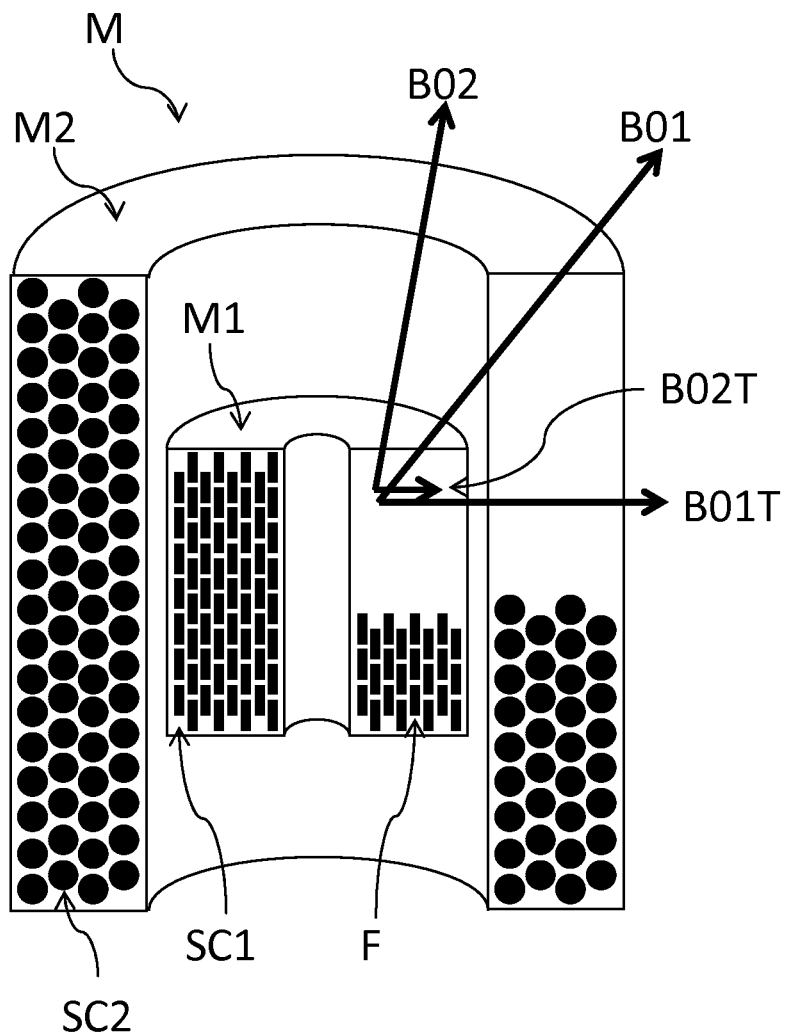
FIG. 9a shows a schematic sectional representation of a magnet arrangement for carrying out the method according to the invention as well as the vectors of the operating magnetic fields of the first and second magnet windings at a location inside the first magnet winding as well as the vector components thereof perpendicular to the tape plane of the tape conductor in the first magnet winding, with an insignificant contribution of the second magnet winding to the entire field component perpendicular to the tape plane at this location.
Figure 9B:
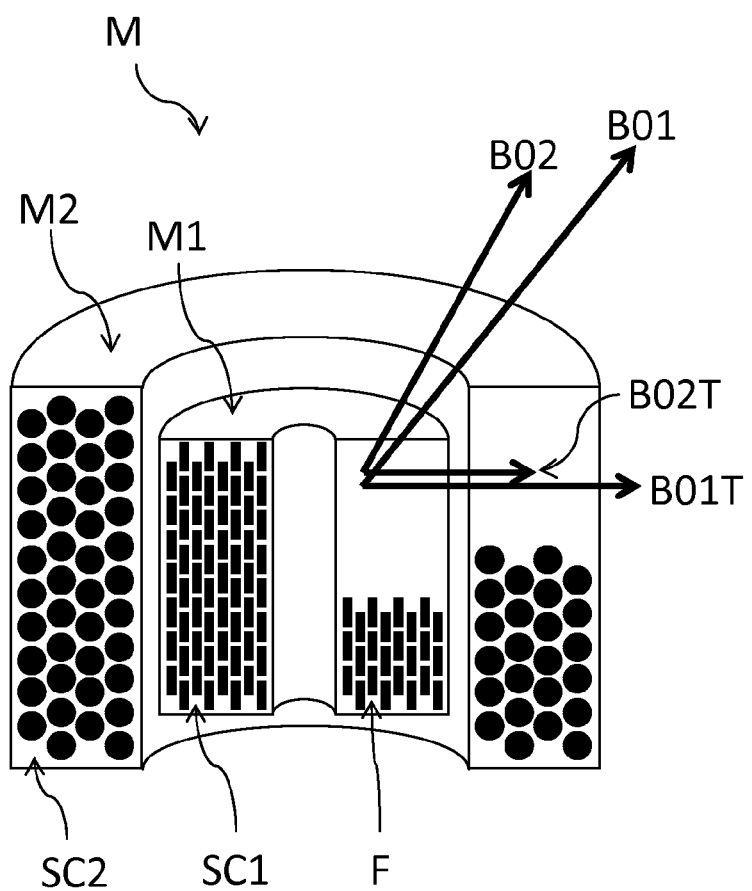
FIG. 9b shows a schematic sectional representation of a magnet arrangement for carrying out the method according to the invention as well as the vectors of the operating magnetic fields of the first and second magnet windings at a location inside the first magnet winding as well as the vector components thereof perpendicular to the tape plane of the tape conductor in the first magnet winding, with a significant contribution of the second magnet winding to the entire field component perpendicular to the tape plane at this location.

FIGS. 9a and 9b show schematic sectional representations of a superconducting magnet arrangement M with a first magnet winding M1 with a tape conductor F made of a first superconductor material SC1 and with a second magnet winding M2 made of a second superconductor material SC2.

Moreover at a location in the cross-section through the first magnet winding M1 the vectors of the first and second operating magnetic field B01 and B02 as well as their components perpendicular to the tape plane B01T and B02T are shown. The operating magnetic field vectors are given by the geometry of the windings and the conductors and by the strength of the first and second operating currents I01 and I02.

In a cylindrically symmetrical magnet arrangement M the magnetic field vectors at a point in space always lie in the plane which is defined by the point in space and the axis of symmetry, that is to say for example in the sectional plane of the representation in FIGS. 9a and 9b. Undesirable superconducting screening currents in the tape conductor F of the first magnet winding M1 are excited mainly by the magnetic field components perpendicular to the tape plane.

For the charging method according to the invention it is significant whether in the volume of the first magnet winding M1 the component B01T of the first operating magnetic field B01 perpendicular to the tape plane predominates, or whether the second operating magnetic field B02 also has at least locally a significant component B02T perpendicular to the tape plane. The first case arises in particular when B01T is at least double the magnitude of B02T (FIG. 9a). The second case arises in particular when B02T is greater than 5% of B02 (FIGS. 9a and 9b).

In the first case the screening currents originate principally from the component of the self-field of the first magnet winding M1 which is perpendicular to the tape plane. The method according to the invention uses the characteristics of such an arrangement, as it applies the steps for suppression of the screening currents preferably to the first magnet winding M1 and after charging of the second magnet winding M2 no further method steps are provided. The first situation is encountered for example in magnet arrangements M having a short, compact HTS insert coil as first magnet winding M1 and a long LTS outer coil as second magnet winding M2. Most magnet arrangements M having HTS and LTS windings have this form, because in this way on the one hand the costs for the expensive HTS conductor are reduced and on the other hand the superconducting current-carrying capacity Ic1 in the tape conductor F is increased (this is limited by the field component perpendicular to the tape plane).

In the second case the second magnet winding M2 also contributes to the excitation of screening currents at least at a location in the first magnet winding M1. The method according to the invention then advantageously comprises the excitation of a first or further pre-operating current I1, I2 in such a way that the self-field of the first magnet winding M1 with the current I1 or I2 at this location has a component perpendicular to the tape plane which corresponds to the sum of the component B01T perpendicular to the tape plane of the first operating magnetic field B01 and at least half of the component B02T perpendicular to the tape plane of the second operating magnetic field B02T at this location.

If the field component B02T perpendicular to the tape plane of the second magnet winding M2 at a location is not insignificant, this can accordingly be "simulated" by overcharging of the first magnet winding M1 before the second magnet winding M2 is actually charged. In this overcharged condition of the first magnet winding M1 the screening currents are then suppressed by the temperature-controlling process. After the cooling to the operating temperature T0 and before or during or after the charging of the second magnet winding M2, the first magnet winding M1 is partially discharged, so that the total field component perpendicular to the tape is kept approximately constant at this location. As a result no new screening currents can be established.

Superconducting magnet arrangements M comprising magnet windings having at least two different superconductor materials with different transition temperatures Tc1, Tc2 are typically arrangements comprising a first magnet winding M1 made of a high-temperature superconductor (HTS) and a second magnet winding M2 composed of one or various low-temperature superconductor(s) (LTS). The most commonly used LTS are the compounds NbTi and Nb3Sn.

The method according to the invention is advantageous in particular when the HTS is of the type ReBCO (Re="rare earth", for example yttrium). For technical applications HTS conductors of this type are typically applied as a thin layer to a tape-like substrate. If a magnetic field perpendicular to the tape plane is applied to such a tape conductor F, the excited screening currents generate particularly strong undesirable magnetic field contributions, for example in the working region of a magnet arrangement M comprising a first magnet winding M1 composed of this conductor.

Furthermore first magnet windings M1 having a ReBCO tape conductor F in a LTS/HTS magnet arrangement M are frequently operated with a first operating current I01 significantly below the superconducting current-carrying capacity Ic1 in the first magnet winding M1, which leads to particularly strong screening currents. However, ReBCO-tape conductors F also have a characteristic which predestines them for the application of the method according to the invention for prevention of screening currents: the dependence of their superconducting current-carrying capacity upon the magnetic field is strongly anisotropic. A magnetic field perpendicular to the tape plane reduces the superconducting current-carrying capacity to a far greater extent than a magnetic field parallel to the tape plane.

This enables a particularly effective application of the embodiment of the method according to the invention in FIG. 5: If in the operational state of the magnet arrangement M the screening currents are for example excited mainly by the self-field of the first magnet winding M1, a first pre-operating current I1 with the strength of the first operating current I01 should be excited. The first pre-operating temperature T1 can then be determined according to the invention such that the superconducting current-carrying capacity Ic1(T1) at the location with the strongest field component perpendicular to the tape plane in the first magnet winding M1 is only slightly higher than the pre-operating current I1 (=I01). This is possible because the superconducting current-carrying capacity Ic1 is typically lowest at this location within the first magnet winding M1 due to the anisotropy of the tape conductor. Thus at this particularly critical location screening currents can be largely suppressed.

After the cooling of the magnet arrangement M to the operating temperature T0, in this embodiment the current and thus the self-field of the first magnet winding M1 is no longer modified, so that the low level of the screening currents is maintained.

Upon excitation of the second operating current I02 in the second magnet winding M2 likewise no substantial screening currents are produced because the second operating field B02 has a component B02T perpendicular to the tape plane which in this example is assumed to be insignificant.

Otherwise a first pre-operating current I1 stronger than the first operating current I01 would be excited (at a lower first pre-operating temperature T1 compared with the previous example), in such a way that the component of the self-field of the first magnet winding M1 perpendicular to the tape plane with the first pre-operating current I1 preferably corresponds to the sum B01T+B02T of the components of the first and second operating fields B01, B02 perpendicular to the tape plane, but at least corresponds to the sum B01T+0.5×B02T of the component B01T of the first operating field B01 perpendicular to the tape plane and of at least half of the component B02T of the second operating field B02 perpendicular to the tape plane.

The method according to the invention can be used in superconducting magnet arrangements in all known magnetic resonance systems, such as for example an MRI scanner, a NMR spectrometer or EPR equipment, but also in high-resolution mass spectroscopy.

Particularly preferably the method according to the invention can be used for homogenizing or stabilizing the static magnetic field in the working volume of a magnetic resonance device, wherein the magnetic resonance device may be a NMR spectrometer, an MRI scanner, a EPR device or an ion cyclotron resonance device.

List of Reference Signs
C. cryostat device
V container of the cryostat arrangement
M superconducting magnet arrangement
F tape conductor
P pancake coil
S solenoid coil
CC cryocooler
M1 first magnet winding
M2 second magnet winding
SC1 first superconductor material
SC2 second superconductor material
t time axis
T temperature of the magnet arrangement
T0 operating temperature
T1 first pre-operating temperature
T2 further pre-operating temperature
Tc1 first transition temperature
Tc2 second transition temperature I current
I01 first operating current
I02 second operating current
I1 first pre-operating current
I2 further pre-operating current
Ic1 superconducting current-carrying capacity in the first magnet winding
B01 first operating magnetic field
B02 second operating magnetic field
B01T component of the first operating magnetic field perpendicular to the tape plane
B02T component of the second operating magnetic field perpendicular to the tape plane
Con1 first power connection
Con2 other power connection
Con3 further power connection List of References

[1] Naoyuki Amemiya and Ken Akachi, "Magnetic field generated by screening current in high Tc superconducting coils for NMR magnets", Supercond. Sci. Technol. 21 (2008)

[2] Y. Yanagisawa et al, "Effect of current sweep reversal on the magnetic field stability for a Bi-2223 superconducting solenoid", Physica C 469, 1996 (2009)

[3] G. P. Mikitik and E. H. Brandt, "Theory of the longitudinal vortex-shaking effect in superconducting strips" Physical Review B 67, 104511 (2003)

[4] E. H. Brandt and G. P. Mikitik, "Why an ac magnetic field shifts the irreversibility line in type-II superconductors", Physical Review Letters 89, 27002 (2002)

[5] K. Kajikawa and K. Funaki, "Reduction of Magnetization in Windings Composed of HTS Tapes", IEEE Transactions on Applied Superconductivity 22, 4400404 (2012)

[6] Y. Yanagisawa et al., "Effect of YBCO-Coil Shape on the Screening Current-Induced Magnetic Field Intensity", IEEE Transactions on Applied Superconductivity 20, 744 (2010)

[7] Y. Yanagisawa et al. "Magnitude of the Screening Field for YBCO Coils", IEEE Transactions on Applied Superconductivity 21, 1640 (2011)

[8] Ahn et al., "Spatial and Temporal Variations of a Screening Current Induced Magnetic Field in a Double-Pancake HTS Insert of an LTS/HTS NMR Magnet"; IEEE Transactions on Applied Superconductivity 19, 2269 (2009)

[9] Y. Yanagisawa et al., "Effect of coil current sweep cycle and temperature change cycle on the screening current-induced magnetic field for YBCO-coated conductor coils", AIP Conference Proceedings 1434, 1373 (2012)

We claim:

1. A method for energizing a superconducting magnet arrangement which is disposed in a cryostat device for cooling to a cryogenic operating temperature, the superconducting magnet arrangement comprising:
   a first magnet winding having a tape conductor with a first superconductor material and a first transition temperature above an operating temperature; and
   a second magnet winding composed of a second superconductor material with a second transition temperature above the operating temperature and at least 15 K below the first transition temperature,
the method comprising the steps of:
   a) temperature-controlling the magnet arrangement to a first pre-operating temperature between the first transition temperature and the operating temperature;
   b) exciting a first pre-operating current after the first pre-operating temperature is reached at least in a part of the first magnet winding;
   c) cooling the magnet arrangement to the operating temperature;
   d) exciting a first operating current at the latest after the operating temperature is reached at least in a part of the first magnet winding, wherein the first magnet winding with the first operating current generates a first operating magnetic field in the volume of the first magnet winding; and
   e) exciting a second operating current at least in a part of the second magnet winding at the latest after cooling of the magnet arrangement to the operating temperature, wherein with the second operating current the second magnet winding generates a second operating magnetic field in the volume of the first magnet winding.

2. The method of claim 1, wherein the magnet arrangement is temperature-controlled to at least a further pre-operating temperature between the first transition temperature and the operating temperature and then a further pre-operating current is excited at least in a part of said first magnet winding.

3. The method of claim 2, wherein a sequence of pre-operating temperatures and/or pre-operating current excitation stages is refined in such a way that a continuous temperature-controlling and cooling procedure of the magnet arrangement to the operating temperature and/or a continuous sequence of pre-operating current excitation stages in said first magnet winding are achieved.

4. The method of claim 2, wherein a first and/or a further excited pre-operating current and the first operating current form a chronologically monotonically increasing sequence of current intensities in said first magnet winding.

5. The method of claim 2, wherein a first and at least one further pre-operating temperature and the operating temperature form a chronologically monotonically decreasing sequence of temperatures.

6. The method of claim 2, wherein a first and/or at least one further excited pre-operating current and the first operating current form a chronological sequence of current intensities in said first magnet winding, values of which decrease towards an end of the sequence.

7. The method of claim 6, wherein the first operating current is smaller than a first excited pre-operating current and/or smaller than at least one further excited pre-operating current.

8. The method of claim 1, wherein temperature-controlling of the superconducting magnet arrangement to a first or a further pre-operating temperature is achieved by filling of a container of the cryostat arrangement with liquid nitrogen or by the operation of a cryocooler.

9. The method of claim 1, wherein cooling of the superconducting magnet arrangement to the operating temperature is achieved by filling of a container of the cryostat arrangement with liquid helium or by the operation of a cryocooler.

10. The method of claim 1, wherein a first and/or a further excited pre-operating current in said first magnet winding at a first and/or a further pre-operating temperature amounts to at least 50%, at least 70% or at least 90% of a superconducting current-carrying capacity at least in a part of said first magnet winding at that temperature and in a self-field of said first magnet winding.

11. The method of claim 1, wherein the magnet arrangement is operated after charging in a steady state with constant operating temperature and with constant first and second operating current.

12. The method of claim 11, wherein the magnet is a part of an arrangement for magnetic resonance processes.

13. The superconducting magnet arrangement of claim 1, wherein the first operating magnetic field at least at one location within said first magnet winding has a component perpendicular to a tape plane which is at least twice as strong as a component perpendicular to a tape plane of the second operating magnetic field at that location.

14. The superconducting magnet arrangement of claim 1, wherein the second operating magnetic field at least at one location within said first magnet winding has a component perpendicular to a tape plane which is at least 5% of a field strength of the second operating magnetic field at that location, wherein said first magnet winding at that location, after temperature-controlling to a first or a further pre-operating temperature and excitation of a first or further pre-operating current, generates a magnetic field of which a component perpendicular to the tape plane corresponds to a sum of a component perpendicular to a tape plane of the first operating magnetic field and at least half of a component perpendicular to a tape plane of the second operating magnetic field at that location.

15. The superconducting magnet arrangement of claim 1, wherein said first magnet winding is wound at least partially with HTS (=high-temperature superconductor) material and said second magnet winding is wound at least partially with LTS (=low-temperature superconductor) material.

16. The superconducting magnet arrangement of claim 1, wherein said first magnet winding is wound with tape conductor with a HTS in a form of a thin layer or of a type ReBCO (Re="rare earth" or yttrium) and said second magnet winding is wound with NbTi and/or $Nb_3Sn$ conductor.

17. The superconducting magnet arrangement of claim 1, wherein a plurality of coaxially stacked pancake coils or a solenoid coil are provided to build said first magnet winding.

18. The superconducting magnet arrangement of claim 1, wherein said first and second magnet windings are equipped with at least three current connections, of which at least a first one only contacts said first magnet winding and at least one other only contacts said second magnet winding and at least one further one only contacts said first magnet winding or said first and second magnet windings together.

19. The superconducting magnet arrangement of claim 1, wherein said first and second magnet windings are connected in series.

20. The superconducting magnet of claim 1, wherein the first and the second operating currents are equally strong.

* * * * *